(12) United States Patent
Kuniyasu et al.

(10) Patent No.: US 6,744,797 B2
(45) Date of Patent: Jun. 1, 2004

(54) SEMICONDUCTOR LASER DEVICE

(75) Inventors: Toshiaki Kuniyasu, Kaisei-machi (JP);
Toshiaki Fukunaga, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/114,059

(22) Filed: Apr. 3, 2002

(65) Prior Publication Data

US 2002/0146051 A1 Oct. 10, 2002

(30) Foreign Application Priority Data

Apr. 5, 2001 (JP) ........................... 2001-106833

(51) Int. Cl.$^7$ ............................................. H01S 5/00
(52) U.S. Cl. ....................... 372/43; 372/44; 372/45; 372/46; 372/47; 372/48; 372/49; 372/50
(58) Field of Search ............................ 372/43–50

(56) References Cited

U.S. PATENT DOCUMENTS

| | | | | |
|---|---|---|---|---|
| 6,127,691 A | * | 10/2000 | Fukunaga et al. | 257/17 |
| 6,285,695 B1 | | 9/2001 | Asano et al. | |
| 6,356,572 B1 | * | 3/2002 | Tanaka et al. | 372/45 |
| 6,396,863 B1 | * | 5/2002 | Fukunaga | 372/46 |
| 6,400,743 B1 | * | 6/2002 | Fukunaga et al. | 372/46 |
| 6,516,016 B1 | * | 2/2003 | Fukunaga et al. | 372/45 |
| 6,546,033 B2 | * | 4/2003 | Fukunaga | 372/45 |

FOREIGN PATENT DOCUMENTS

| | | |
|---|---|---|
| JP | 11-298086 | 10/1999 |
| JP | 2000-31596 | 1/2000 |

* cited by examiner

*Primary Examiner*—Paul Ip
*Assistant Examiner*—Delma R. Flores-Ruiz
(74) *Attorney, Agent, or Firm*—Sughrue Mion, PLLC

(57) ABSTRACT

A semiconductor laser device improves reliability during high-power oscillation. An n-type GaAs buffer layer, an n-type $In_{0.48}Ga_{0.52}P$ lower cladding layer, an n-type or i-type $In_{x1}Ga_{1-x1}As_{1-y1}P_{y1}$ optical waveguide layer, an i-type $GaAs_{1-y2}P_{y2}$ tensile-strain barrier layer, an $In_{x3}Ga_{1-x3}As_{1-y3}P_{y3}$ compressive-strain quantum-well active layer, an i-type $GaAs_{1-y2}P_{y2}$ tensile-strain barrier layer, a p-type or i-type $In_{x1}Ga_{1-x1}As_{1-y1}P_{y1}$ upper optical waveguide layer, a p-type $In_{0.48}Ga_{0.52}P$ first upper cladding layer, a GaAs etching stop layer, a p-type $In_{0.48}Ga_{0.52}P$ second upper cladding layer, and a p-type GaAs contact layer are grown on a plane of an n-type GaAs substrate. Two ridge trenches are formed on the resultant structure, and current non-injection regions are formed by removing the p-type GaAs contact layer in portions extending inwardly by 30 μm from cleavage positions of edge facets of the resonator on a top face of a ridge portion between the ridge trenches.

8 Claims, 4 Drawing Sheets

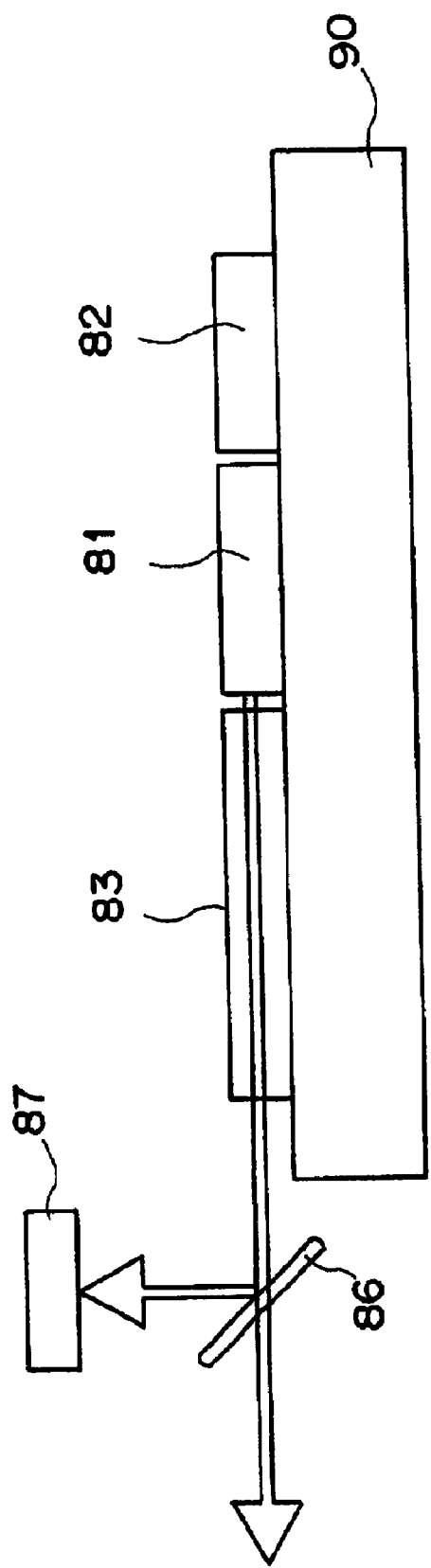

SEMICONDUCTOR LASER DEVICE

BACKGROUND OF THE INVENTION

1. Field of the Invention

The present invention relates to a semiconductor laser device, and particularly to a semiconductor laser device having a window structure formed therein.

2. Description of the Related Art

In a semiconductor laser device, a current density at its edge facets increases under high power oscillation, so that an optical density increases and breakage and the like occurs at the edge facets, thereby making it difficult to obtain high reliability. Thus, there have been made many proposals concerning a structure, so-called a window structure, for providing current non-injection regions in the vicinities of the edge facets of a resonator.

In the gazette of Japanese Unexamined Patent Publication No. 2000-31596 is, for example, a window structure fabricated in such a manner that a cladding layer disclosed is etched to the vicinity of a quantum-well active layer and a re-grown cladding layer added with dopant is formed, whereby the dopant is diffused to the quantum-well layer and is subjected to mixed crystallization. However, the window structure described above has a problem such that variations of thermal diffusion in a regrowth process make the depth of diffusion and the mixed crystallization uneven, deteriorating reproducibility of the window structure. Thus, in high power oscillation, it has been difficult to obtain a highly reliable semiconductor laser at high yields. Furthermore, in the constitution described above, three crystal growth processes and two dry etching processes must be performed in order to fabricate an element. Thus, there is concern for complication in actual manufacture thereof and for increase in costs.

Meanwhile, in Japanese Unexamined Patent Publication No. 11 (1999)-298086, a semiconductor laser device is proposed, which is capable of increasing a bandgap and of reducing light absorption at end facets of the device. Such an increase in the bandgap is realized by lattice relaxation in the vicinity of an active layer, the lattice relaxation being attributable to adoption of a semiconductor layer constitution having strain compensation incorporated in the periphery of the active layer. With the above semiconductor layer constitution, element separation by cleavage causes lattice relaxation at an edge of light emission and increases the bandgap, whereby a window portion is naturally formed. However, in the foregoing semiconductor laser device, since current injection regions extending to end facets of the device are formed, there is a problem that a complete window structure cannot be formed.

SUMMARY OF THE INVENTION

An object of the present invention, in consideration for the above circumstances, is to provide a semiconductor laser device provided with a precise window structure which can be manufactured in a simple process and at high yields.

A semiconductor laser device of the present invention comprises a GaAs substrate, a cladding layer of a first conductivity type formed on the GaAs substrate, a first optical waveguide layer formed on the cladding layer of the first conductivity type, a first $GaAs_{1-y2}P_{y2}$ barrier layer formed on the first optical waveguide layer, an $In_{x3}Ga_{1-x3}As_{1-y3}P_{y3}$ quantum-well active layer formed on the first $GaAs_{1-y2}P_{y2}$ barrier layer, a second $GaAs_{1-y2}P_{y2}$ barrier layer formed on the $In_{x3}Ga_{1-x3}As_{1-y3}P_{y3}$ quantum-well active layer, a second optical waveguide layer formed on the second $GaAs_{1-y2}P_{y2}$ barrier layer, a cladding layer of a second conductivity type formed on the second optical waveguide layer, a GaAs contact layer formed on the cladding layer of the second conductivity type and an electrode formed on the GaAs contact layer. Each of the cladding layers of the first and second conductivity types has a composition which lattice-matches with the GaAs substrate. Each of the first and second optical waveguide layers has an InGaAsP series composition which lattice-matches with the GaAs substrate. Each of the first and second barrier layers is a layer which has a tensile strain relative to the GaAs substrate and has a layer thickness of 10 to 30 nm. Each barrier layer has a composition which satisfies a condition that the product of a strain amount of the tensile strain and the layer thickness of the barrier layer is in the range of 5 to 20% nm. The $In_{x3}Ga_{1-x3}As_{1-y3}P_{y3}$ quantum-well active layer is a layer having a layer thickness in the range of 6 to 10 nm and has a composition having a compressive strain of 1.0% or more with respective to the GaAs substrate. The absolute value of the sum of the product of the strain amount and layer thickness of the first barrier layer and the product of the strain amount and layer thickness of the second barrier layer is greater than the absolute value of the product of the strain amount and layer thickness of the quantum-well active layer. The semiconductor laser device has a current non-injection region formed in a portion including at least one of the resonator edge facets.

The current non-injection region is preferably formed in a region where a distance extending from the edge facet toward the inner portion of the resonator is in the range of 5 $\mu$m to 50 $\mu$m.

A current non-injection region may also be formed by forming the GaAs contact layer in a place on the cladding layer of the second conductivity type other than the current non-injection region.

Besides the above, a current non-injection region may also be formed by providing an insulating layer or the like in the vicinity of the end facet between the active layer and the contact layer.

Moreover, in the foregoing semiconductor laser device, a current confinement layer of a first conductivity type may be provided between the second optical waveguide layer and the cladding layer of the second conductivity type.

Here, the first conductivity type and the second conductivity type are opposite to each other. For example, when the first conductivity type is a p-type, the second conductivity type is an n-type.

Compared with a conventional semiconductor laser with a 1.0 $\mu$m band, which includes aluminum (Al) in an active layer, the semiconductor laser device of the present invention has high reliability regarding durability because the active layer is constituted by a composition including no aluminum (Al). Moreover, the semiconductor laser device of the present invention is capable of increasing a bandgap by lattice relaxation in the vicinity of the active layer, which is attributable to the GaAsP tensile-strain barrier layers provided therein, and is capable of reducing light absorption at the light emission edge facet of the device. Furthermore, with respect to the active layer having the compressive strain approximate to a critical film thickness during crystal growth, tensile strains are added to the first and second barrier layers to compensate for a part of the strain of the active layer. Thus, a high-quality active layer can be formed. In addition, surface diffusion of indium (In) caused during the growth can be suppressed by the existence of the GaAsP layer, whereby a high-quality crystal can be obtained. Moreover, the GaAsP tensile-strain barrier layers increase the height of walls between the active layer and the barrier layers, whereby leakage of electrons and electron holes from the active layer to the optical waveguide layers can be reduced. Owing to the effects as described above, driving currents can be reduced, and generation of heat at the edge facets of the device can be reduced. Furthermore, since the current non-injection regions are provided in the vicinities of the resonator edge facets, currents are not injected into the vicinities of the resonator edge facets, whereby current densities at the edge facets can be reduced and generation of heat at the edge facets can be further reduced. Accordingly, breakage of the edge facets and the like due to increase in an optical density can be suppressed. Therefore, highly reliable beams can be obtained from a low-power operation through a higher-power operation.

If the current non-injection region is constructed by forming the GaAs contact layer in a place on the cladding layer of the second conductivity type other than the current non-injection region, the current non-injection region can be constructed very easily and surely.

BRIEF DESCRIPTION OF THE DRAWINGS

FIG. 4 is a constitutional view schematically showing an embodiment of a laser emitting apparatus using the semiconductor laser device of the present invention.

DESCRIPTION OF PREFERRED EMBODIMENTS

Description will be given of a semiconductor laser device according to an embodiment of the present invention, along with its manufacturing process. FIGS. 1A to 1D are perspective views showing respective steps of fabricating the semiconductor laser device.

Figure 1A:
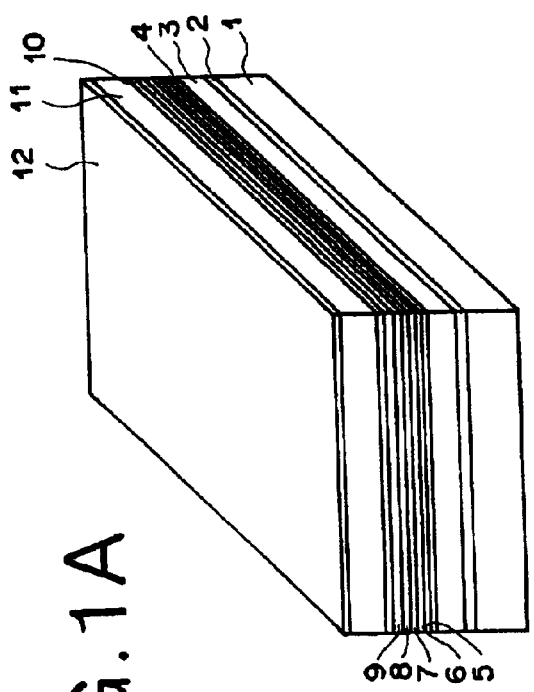
FIGS. 1A to 1D are perspective views showing respective steps of fabricating a semiconductor laser device according to a first embodiment of the present invention.
Figure 1B:
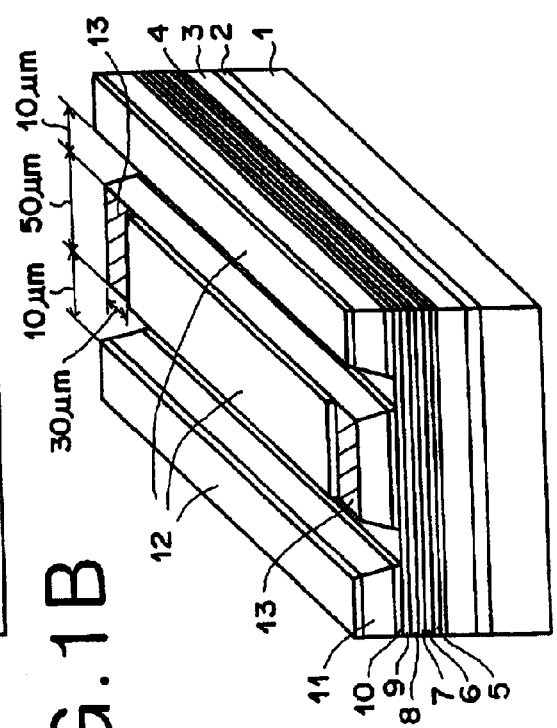

As shown in FIG. 1A, on a plane (100) of an n-type GaAs substrate 1, grown by organometallic vapor phase expitaxy are an n-type GaAs buffer layer 2, an n-type $In_{0.48}Ga_{0.52}P$ lower cladding layer 3, an n-type or i-type $In_{x1}Ga_{1-x1}As_{1-y1}P_{y1}$ optical waveguide layer 4, an i-type $GaAs_{1-y2}P_{y2}$ tensile-strain barrier layer 5, an $In_{x3}Ga_{1-x3}As_{1-y3}P_{y3}$ compressive-strain quantum-well active layer 6, an i-type $GaAs_{1-y2}P_{y2}$ tensile-strain barrier layer 7, a p-type or i-type $In_{x1}Ga_{1-x1}As_{1-y1}P_{y1}$ upper optical waveguide layer 8, a p-type $In_{0.48}Ga_{0.52}P$ first upper cladding layer 9, a GaAs etching stop layer 10, a p-type $In_{0.48}Ga_{0.52}P$ second upper cladding layer 11 and a p-type GaAs contact layer 12.

Thereafter, resist (not shown) is applied to the resultant structure. Then, by normal lithography, openings having a width of 10 μm are made, at an interval of 50 μm, in the p-type $In_{0.48}Ga_{0.52}P$ second upper cladding layer 11 and the p-type GaAs contact layer 12, the openings being stripe portions, so that the stripe portions are parallel to an orientation flat of the foregoing substrate 1 and perpendicular to a cleavage plane of a laser. Thus, a pattern of two ridge grooves is formed. Along the pattern, the p-type GaAs contact layer 12 is removed by etching with tartaric acid, and the p-type $In_{0.48}Ga_{0.52}P$ second upper cladding layer 11 is subsequently removed by etching with a hydrochloric acid solution. Next, openings are made in the resist at portions (portions 13 indicated by oblique lines in FIG. 1B) on a top face of a ridge portion between the two ridge grooves formed in the previous step, the portions extending inwardly by 30 μm from cleavage positions of edge facets of the resonator. Then, portions of the p-type GaAs contact layer 12, which are exposed by the above openings, are removed by use of a $NH_3$:$H_2O_2$ mixed solution, thus forming current non-injection regions. Meanwhile, the GaAs etching stop layer 10 at bottom faces of the ridge grooves is removed, and then the resist is exfoliated (see FIG. 1B).

Figure 1C:
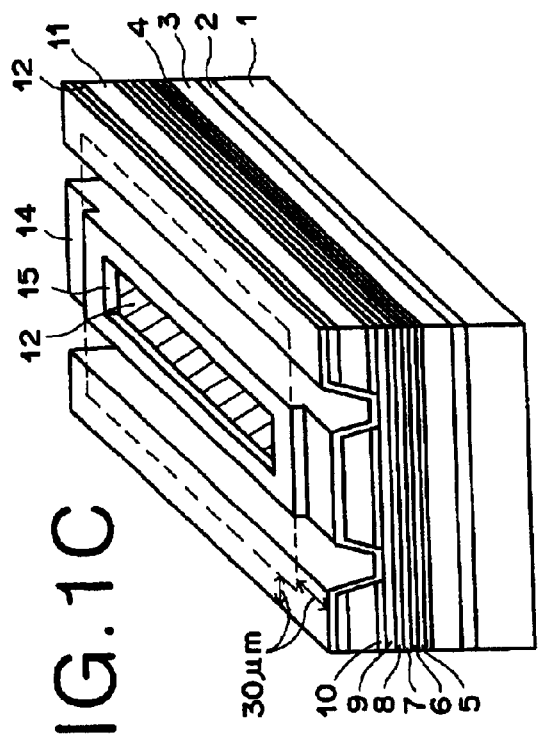
Figure 1D:
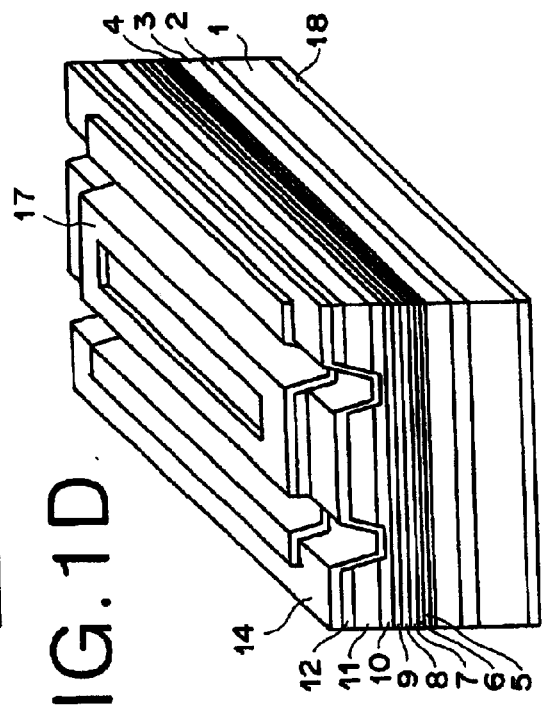

Next, as shown in FIG. 1C, a $SiO_2$ insulating film 14 is formed on the resultant structure by a chemical vapor deposition (CVD) method, and resist (not shown) is further applied thereon. Then, an opening is provided at the portion, where the contact layer 12 is formed, on the top face of the ridge portion formed to have the width of 50 μm in the precedent step. A portion of the $SiO_2$ insulating film 14, which is exposed by the opening, is removed by etching, thus exposing the contact layer 12 in a current injection region 15 (a region indicated by hatching in FIG. 1C). After the exfoliation of the resist, a resist pattern is formed again by a photolithography method, the resist pattern having an opening at a portion which includes the current injection region 15 and is surrounded by a dotted line in the drawing. A width of the resist pattern is 60 μm, and the resist pattern is in a state where the resist is formed in a place corresponding to a peripheral portion of the device, which extends inwardly by 30 μm from respective cleavage plane positions of each device. A Ti/Pt/Au electrode material is deposited on the resist pattern by a vacuum evaporation method, and the electrode material deposited on the resist is exfoliated together with the resist, thus forming an electrode 17 in the portion surrounded by the dotted line, that is, in the opening of the resist pattern (see FIG. 1D).

Thereafter, sintering is performed at 400° C., an exposed (opposite) surface of the n-type GaAs substrate 1 is ground until reaching a thickness of 100 μm, and an AuGe/Ni/Au electrode 18 is vacuum-deposited on the polished surface, followed by another sintering at 350° C.

Figure 2:
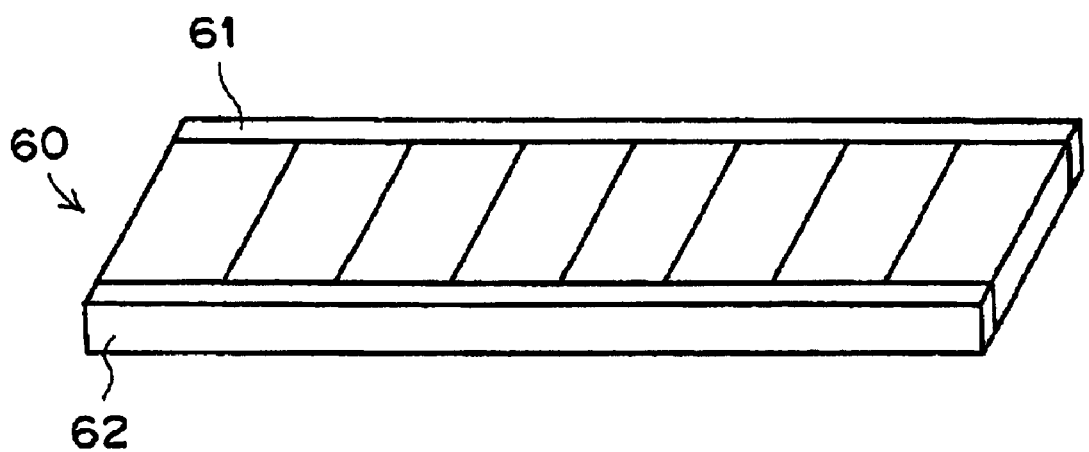
FIG. 2 is a perspective view showing an array bar cleaved at resonator edge facets.

Subsequently, as shown in FIG. 2, the layered construction is cleaved at preset positions of the resonator edge facets, thus forming a laser array bar 60. A high reflectance coating 61 and a low reflectance coating 62 are provided on respective resonator edge facets of the laser array bar 60. The laser array bar 60 is further cleaved at positions of each laser device edge facets and is formed into a chip, thus a semiconductor laser device is formed.

Note that each of the cladding layers 3 and 11 and each of the optical waveguide layers 4 and 8 have composition ratios so as to lattice-match with the GaAs substrate 1, respectively. In the present embodiment, the quantum-well active layer 6 has a composition having a compressive strain of 1.5% with respect to the substrate 1 and has a layer thickness of 6 nm. In addition, each of the tensile-strain barrier layers 5 and 7 has a composition having a strain amount set at 0.7% with respect to the substrate 1 and has a layer thickness of 10 nm. Note that the strain and the layer thickness of each layer are not necessarily limited to the foregoing values. The quantum-well active layer 6 may have a predetermined layer thickness in the range of 6 to 10 nm and may have a composition having a compressive strain, with respective to the substrate 1, in the range of 1.0% to 3.0%, more preferably in the range of 1.0% to 2.5%. In addition, each of the tensile-strain barrier layers 5 and 7 may have a predetermined layer thickness in the range of 10 to 30 nm and may have a composition in which the product of the strain amount and the layer thickness is in the range of 5 to 20% nm. The absolute value of the sum of the product of the strain amount and layer thickness of the tensile-strain barrier layer 5 and the product of the strain amount and layer thickness of the tensile-strain barrier layer 7 may be greater than the absolute value of the product of the strain amount and layer thickness of the quantum-well active layer 6, more preferably greater by −3% nm or more. Moreover, the width of the light emitting region is not limited to the foregoing value, and similarly, the width of the ridge groove is not limited to 10 μm but may be formed extending to the periphery of the device. In general, the strain amount Δa is defined by the equation expressed as follows. When a lattice constant of the GaAs substrate is aGaAs and a lattice constant of the barrier layer to be an object thereof is a, the strain amount with respect to the GaAs substrate is expressed by the equation of $\Delta a = (a - aGaAs)/aGaAs \times 100\%$. Here, regarding the value of Δa, a positive value thereof means a compressive strain and a negative value thereof means a tensile strain.

The semiconductor laser device of the present invention has high durability because the active layer 6 therein includes no aluminum (Al). Moreover, the semiconductor laser device of the present invention is capable of enlarging a bandgap by lattice relaxation in the vicinity of the active layer, which is attributable to the GaAsP tensile-strain barrier layers 5 and 7 provided therein, and is capable of reducing light absorption at the light emission edge facet of the device. Furthermore, with respect to the active layer 6 having the compressive strain approximate to a critical film thickness during crystal growth, tensile strains are added to the tensile-strain barrier layers 5 and 7 to compensate for a part of the strain of the active layer 6. Thus, a high-quality active layer 6 can be formed. Moreover, the GaAsP tensile-strain barrier layers 5 and 7 increase the height of walls between the active layer and the barrier layers, whereby leakage of electrons and electron holes from the active layer to the optical waveguide layers can be reduced. Owing to the effects as described above, driving currents can be reduced, and generation of heat at the edge facets of the device can be reduced. Furthermore, since the current non-injection regions with the p-type GaAs contact layer 12 removed therefrom are provided in the regions in the vicinities of the resonator edge facets, a current density and generation of heat at the edge facets can be reduced. Accordingly, breakage of the edge facets and the like due to increase in an optical density can be suppressed. Therefore, highly reliable beams can be obtained during oscillation from low power through high power.

Although description has been made for the laser of multi-mode oscillation in the foregoing embodiment, a semiconductor laser device with narrow stripes of about 3 μm can be similarly fabricated.

In the foregoing embodiment, the case of using the GaAs substrate of an n-type is described; however, a substrate of a p-type conductivity may also be used. In this case, the conductivity of each of the foregoing layers may be reversed.

For the growth method of each layer, molecular beam epitaxy in which material is solid or gas may be employed.

In the foregoing embodiment, the current non-injection region is the region extending inwardly by 30 μm from the resonator edge facet; however, it is satisfactory that the region extends 5 μm or more and 50 μm or less from the edge facet. Note that, when the distance extending from the edge facet toward the inside of the resonator is 5 μm or less, current spreading caused by the contact layer makes it substantially impossible to form the current non-injection region. Thus, the edge facet is deteriorated by generation of heat. On the other hand, when the distance extending from the edge facet toward the inside of the resonator is 50 μm or more, light loss due to light absorption in the current non-injection region is increased, reducing optical output.

Moreover, the effect of suppressing the edge facet breakage caused by the increase in the optical density can be obtained even if the current non-injection region is not provided to both edge facets, but to only one edge facet.

Next, section views of a semiconductor laser device according to a second embodiment of the present invention are shown in FIGS. 3A to 3D with reference to the respective steps of fabrication thereof. Description will be made below for a layer constitution of the semiconductor laser device of the embodiment, together with a fabrication method thereof.

Figure 3A:
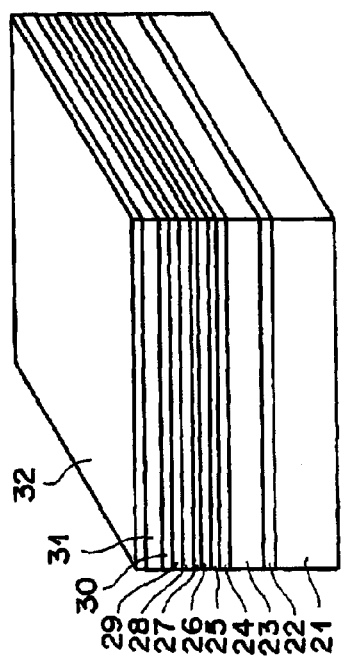
FIGS. 3A to 3D are perspective views showing respective steps of fabricating a semiconductor laser device according to a second embodiment of the present invention.
Figure 3B:
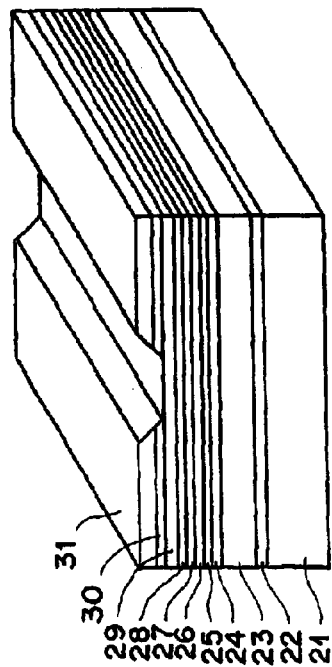

As shown in FIG. 3A, on a plane(100) of an n-type GaAs substrate 21, grown by organometallic vapor phase epitaxy are an n-type GaAs buffer layer 22, an n-type $In_{0.48}Ga_{0.52}P$ lower cladding layer 23, an n-type or i-type $In_{x1}Ga_{1-x1}As_{1-y1}P_{y1}$ optical waveguide layer 24, an i-type $GaAs_{1-y2}P_{y2}$ tensile-strain barrier layer 25, an $In_{x3}Ga_{1-x3}As_{1-y3}P_{y3}$ compressive-strain quantum-well active layer 26, an i-type $GaAs_{1-y2}P_{y2}$ tensile-strain barrier layer 27, a p-type or i-type $In_{x1}Ga_{1-x1}As_{1-y1}P_{y1}$ upper optical waveguide layer 28, a p-type $In_{0.48}Ga_{0.52}P$ first upper cladding layer 29, a GaAs etching stop layer 30, an n-type $In_{0.48}Ga_{0.52}P$ confinement layer 31 and a GaAs cap layer 32.

Thereafter, by use of photolithography, a resist pattern is prepared, in which an opening region having a stripe of 3 μm is formed in a forward mesa direction with respect to the substrate, and then the GaAs cap layer 32 is etched with a tartaric acid mixed solution. After exfoliation of the resist, by use of the GaAs cap layer 32, as a mask, having the opening formed therein, the n-type $In_{0.48}Ga_{0.52}P$ confinement layer 31 is etched with a hydrochloric acid solution. Furthermore, with the tartaric acid mixed solution, the remaining GaAs cap layer 32 and the portion of the GaAs etching stop layer 30, which is exposed by the etching of the confinement layer 31, are removed (see FIG. 3B).

Figure 3C:
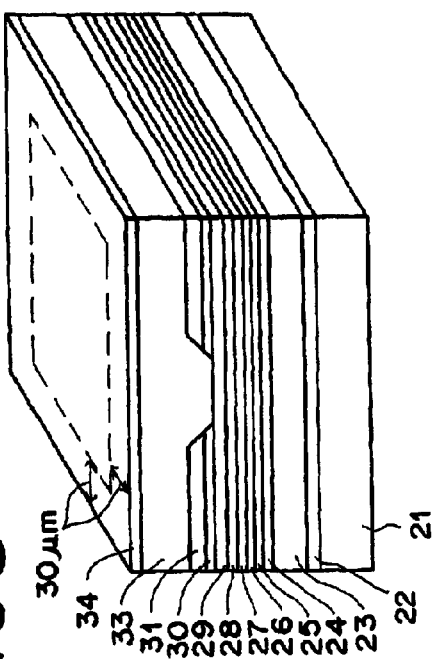
Figure 3D:
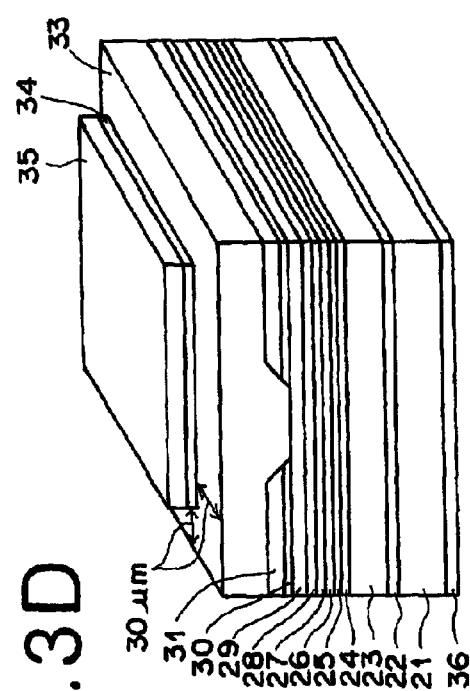

Next, as shown in FIG. 3C, a p-type $In_{0.48}Ga_{0.52}P$ second upper cladding layer 33 and a p-type GaAs contact layer 34 are formed again by organometallic vapor phase epitaxy. By use of photolithography, a resist pattern having an opening in a portion surrounded by a dotted line in the drawing is formed. A width of the resist pattern is 60 μm, and the resist pattern is in a state where the resist is formed in a place corresponding to a peripheral portion of the device, which extends inwardly by 30 μm from respective cleavage plane positions of each device. A Ti/Pt/Au electrode material is deposited on the resist pattern by a vacuum evaporation method, and the electrode material deposited on the resist is exfoliated together with the resist, thus forming an electrode 35 in the portion surrounded by the dotted line, that is, in the opening of the resist pattern. Furthermore, by use of the electrode 35 as a mask, the p-type GaAs contact layer 34 in the peripheral portion of the device is removed by etching with a $NH_3:H_2O_2$ solution (see FIG. 3D). The region from which the contact layer 34 is removed corresponds to a current non-injection region.

Thereafter, sintering is performed at 400° C., an exposed (opposite) surface of the n-type GaAs substrate 21 is ground until reaching a thickness of 100 μm, and an AuGe/Ni/Au electrode 36 is vacuum-deposited on the polished surface, followed by another sintering at 350° C.

Subsequently, the layered construction is cleaved at preset positions of the both edge facets, thus forming a laser array bar. A high reflectance coating and a low reflectance coating are provided on respective resonator surfaces of the laser array bar. The laser array bar is further cleaved at positions of each laser device and is formed into a chip, thus forming a semiconductor laser device.

The width of the light emitting region where the opening is made in the confinement layer is not limited to the foregoing value.

The composition, strain amount, layer thickness and the like of each layer of the semiconductor laser device according to the present embodiment are approximately identical to those of the foregoing first embodiment, achieving similar effects to those of the first embodiment. Similarly in the semiconductor laser device of the embodiment, since the current non-injection region with the p-type GaAs contact layer 34 removed therefrom is provided in the region of the vicinity of the resonator edge facets, a current density and generation of heat at the edge facets can be reduced. Accordingly, breakage of the edge facets and the like due to increase in an optical density can be suppressed. Therefore, highly reliable beams of a single transverse mode can be obtained during oscillation from low power through high power.

Next, a laser emitting apparatus including the semiconductor laser device of the present invention will be described with reference to FIG. 4. The laser emitting apparatus showing in FIG. 4 is provided with, for example, a semiconductor laser device 81 for emitting a single-transverse-mode laser beam, which is described in the foregoing second embodiment; a waveguide grating 82, mounted on the same axis as the semiconductor laser device 81, for locking a wavelength of the laser beam emitted from the semiconductor laser device 81; and an optical wavelength converting device 83 for generating a second harmonic by converting the wavelength of the laser beam into a half wavelength thereof upon receiving direct irradiation of the laser beam emitted from the semiconductor laser device 81 having the locked wavelength. Here, the optical wavelength converting device 83 is a second harmonic generating device (SHG device) which is constituted by forming a synchronous domain inversion structure in an optical waveguide formed on a LiNbO3 substrate (LN substrate). Note that the semiconductor laser device 81, the waveguide grating 82 and the optical wavelength converting device 83 are disposed on a Peltier device 90, and temperature control is performed by the Peltier device 90.

The laser beam emitted from the optical wavelength converting device 83 is partially split by a beam splitter 86 and is detected by a photodetector 87. Then, an optical intensity signal thus detected is fed back to an automatic power control circuit (APC circuit) (not shown). Based on the optical intensity signal, the APC circuit changes a value of a drive current supplied to the semiconductor laser device 81 so as to maintain the optical intensity constant, thereby controlling an optical power of the laser beam at a predetermined value.

The foregoing laser emitting apparatus can be used as a laser emitting apparatus with a stable output power, owing to the use of the semiconductor laser device of the present invention, as a light source, which is highly reliable also during high-power oscillation.

Moreover, other than the foregoing embodiments, the semiconductor laser device according to the present invention can also be utilized in mounting an array-type semiconductor laser device, an optical integrated circuit and the like.

Furthermore, the semiconductor laser device of the present invention and the apparatus thereof, because of its capability of emitting a highly reliable laser beam from a low-power operation through a high-power operation, is applicable as a light source in the fields of high-speed information/image processing, communications, laser measurement, medicine and printing.

What is claimed is:

1. A semiconductor laser device, comprising
   a GaAs substrate;
   a cladding layer of a first conductivity type formed on the GaAs substrate;
   a first optical waveguide layer formed on the cladding layer of the first conductivity type;
   a first $GaAs_{1-y2}P_{y2}$ barrier layer formed on the first optical waveguide layer;
   an $In_{x3}Ga_{1-x3}As_{1-y3}P_{y3}$ quantum-well active layer formed on the first $GaAs_{1-y2}P_{y2}$ barrier layer;
   a second $GaAs_{1-y2}P_{y2}$ barrier layer formed on the $In_{x3}Ga_{1-x3}As_{1-y3}P_{y3}$ quantum-well active layer;
   a second optical waveguide layer formed on the second $GaAs_{1-y2}P_{y2}$ barrier layer;
   a cladding layer of a second conductivity type formed on the second optical waveguide layer;
   a GaAs contact layer formed on the cladding layer of the second conductivity type; and
   an electrode formed on the GaAs contact layer, wherein
   each of said cladding layers of the first and second conductivity types has a composition which lattice-matches with said GaAs substrate,
   each of said first and second optical waveguide layers has a InGaAsP series composition which lattice-matches with said GaAs substrate,
   each of said first and second barrier layers has a thickness of 10 to 30 nm which has a tensile strain with respect to said GaAs substrate and has a composition which satisfies that the product of a strain amount of the tensile strain and the layer thickness is in the range of 5 to 20% nm,
   said $In_{x3}Ga_{1-x3}As_{1-y3}P_{y3}$ quantum-well active layer has a thickness in the range of 6 to 10 nm and has a composition having a compressive strain of not less than 1.0% with respective to said GaAs substrate, and
   the absolute value of the sum of the product of the strain amount and the thickness of said first barrier layer and the product of the strain amount and the thickness of said second barrier layer is greater than the absolute value of the product of the strain amount and the thickness of said quantum-well active layer, and wherein
      a current non-injection region is formed in a portion including at least one of resonator edge facets.

2. The semiconductor laser device according to claim 1, wherein said current non-injection region is formed in a region where a distance extending from said edge facet toward the inner portion of the resonator is in the range of 5 μm to 50 μm.

3. The semiconductor laser device according to claim 1, wherein said GaAs contact layer is formed in a place on said cladding layer of the second conductivity type other than said current non-injection region.

4. The semiconductor laser device according to claim 2, wherein said GaAs contact layer is formed in a place on said cladding layer of the second conductivity type other than said current non-injection region.

5. The semiconductor laser device according to claim 1, wherein a current confinement layer of a first conductivity type is provided between said second optical waveguide layer and said cladding layer of the second conductivity type.

6. The semiconductor laser device according to claim 2, wherein a current confinement layer of a first conductivity type is provided between said second optical waveguide layer and said cladding layer of the second conductivity type.

7. The semiconductor laser device according to claim 3, wherein a current confinement layer of a first conductivity type is provided between said second optical waveguide layer and said cladding layer of the second conductivity type.

8. The semiconductor laser device according to claim 4, wherein a current confinement layer of a first conductivity type is provided between said second optical waveguide layer and said cladding layer of the second conductivity type.

* * * * *